United States Patent
Suaya et al.

(10) Patent No.: US 6,934,669 B1
(45) Date of Patent: Aug. 23, 2005

(54) CAPACITANCE MEASUREMENTS FOR AN INTEGRATED CIRCUIT

(76) Inventors: Roberto Suaya, 8 Allee de la Roseraie, 38240 Meylan (FR); Sophie H. M. Gabillet, 23 Rue de Tournelles, 92290 Chatenay Malabry (FR)

(*) Notice: Subject to any disclaimer, the term of this patent is extended or adjusted under 35 U.S.C. 154(b) by 0 days.

(21) Appl. No.: 09/385,666

(22) Filed: Aug. 26, 1999

(51) Int. Cl.$^7$ .................. G06F 17/50; G01R 31/26
(52) U.S. Cl. ................. 703/14; 703/2; 324/663; 324/676; 324/765; 324/658
(58) Field of Search ................. 703/2, 14, 13, 703/4; 324/658, 663, 676, 675, 765, 519, 520, 158.1; 716/4, 6

(56) References Cited

U.S. PATENT DOCUMENTS

| | | | |
|---|---|---|---|
| 5,212,454 A | * 5/1993 | Proebsting | 324/678 |
| 5,901,063 A | 5/1999 | Chang et al. | 364/488 |
| 5,999,010 A | 12/1999 | Arora et al. | |
| 6,011,731 A | * 1/2000 | Beigel et al. | 365/189.09 |
| 6,249,903 B1 | * 6/2001 | McSherry et al. | 716/11 |
| 6,300,765 B1 | * 10/2001 | Chen | 324/519 |
| 6,414,498 B2 | * 7/2002 | Chen | 324/678 |

OTHER PUBLICATIONS

Chen et al, "An On–Chip, Attofarad Interconnect Charge–based Capacitance Measurement Technique", IEEE, 1996, pp. 3.4.1–3.4.4.*

Sylvester et al, "Investigation of Interconnect Capacitance Characterization using Charge–based Capacitance Measurement Technique and 3–D Simulation", IEEE, 1997, pp. 491–494.*

* cited by examiner

*Primary Examiner*—Thai Phan
(74) *Attorney, Agent, or Firm*—Klarquist Sparkman LLP

(57) ABSTRACT

A method and apparatus for determining capacitance of wires in an integrated circuit is described. The capacitance information derived according to the invention can be used, for example, to calibrate a parasitic extraction engine or to calibrate an integrated circuit fabrication process. The capacitance information can also be used for timing and noise circuit simulations, particularly for deep sub-Micron circuit design simulations. Briefly, the invention allows measurement of both total capacitance of a line and cross coupling capacitance between two lines by applying predetermined voltage signals to specific circuit elements. The resulting current allows simple computation of total capacitance and cross coupling capacitance. Multiple cross coupling capacitance can be measured with a single device, thus improving the art of library generation, and the overall method is free of uncertainties related to transistor capacitance couplings. The capacitance values obtained can then be used to calibrate procedures, processes, devices, etc.

8 Claims, 7 Drawing Sheets

CAPACITANCE MEASUREMENTS FOR AN INTEGRATED CIRCUIT

FIELD OF THE INVENTION

The invention relates to circuit design parameter measurement. More particularly, the invention relates to a method and apparatus for high precision measurement of cross coupling and total capacitance of wires on an integrated circuit design.

BACKGROUND OF THE INVENTION

Until the advent of deep sub micron integrated circuit processes, timing behavior of integrated circuits has been dictated by transistor considerations, mostly transistor travel time and the number of logic levels a signal traverses during a clock cycle. Accurate models of transistor device parameters were the key element for the prediction of circuit timing behavior.

For feature sizes larger than 0.35 $\mu$m wire delay is typically less than 20% of total timing delay. To account for the 20% contribution to total timing delay high precision delay estimates were not required for wire delay. A relatively large (e.g., 25%) uncertainty in extracting resistance and/or capacitance values results in approximately a 4% overall error in time delay modeling.

Computer aided design (CAD) programs used for integrated circuit design used simplified models to compute wire delay from resistance and capacitance data extracted using a layout database. Resistance and capacitance models that provide less than 25% uncertainty are well known in the art. For example, resistance estimates can be generated based on the geometric shape of the line to be estimated. Capacitance estimates can be generated based on a parallel plate capacitor model with perimeter fringe contribution corrections. These modeling approaches are useful for integrated circuit designs having device sizes greater than 0.35 $\mu$m.

However, as device sizes decrease the relative importance of wire delay increases. Wire extraction programs can be calibrated with accurate measurements of capacitance. One approach to accurate wire capacitance measurement is provided by B. W. McGaughy, J. C. Chen, D. Sylvester and C. Hu "A Simple Method for On-Chip Sub-Femto Farad Interconnect Capacitance Measurement," *IEEE Electron. Device Letters*, Vol. 18, No. 1, pp. 21–23, January 1997, (hereinafter referred to as "the IEEE paper"), which discloses a method for determining cross coupling capacitance. However, the method described in the IEEE paper suffers shortcomings that are explained in detail in a white paper by J. C. Chen and Roberto Suaya entitled "Proper On-Chip Capacitance Measurement," (hereinafter referred to as "the white paper"). A brief overview of the white paper is provided below.

FIG. 1 represents the circuit 10 used in the IEEE paper to measure cross coupling capacitance. A general method to measure capacitance consists of measuring the total charge deposited on the capacitor, which can be accomplished by measuring DC currents, frequency of applied signals, and voltage. The following formula permits the determination of capacitance:

$$I = CV_{dd}f \qquad \text{(Equation 1)}$$

where I is a dc current reading, C is a load capacitance, $V_{dd}$ is the voltage supply level, and f is the frequency of the waveforms applied.

The voltage waveform of FIG. 2 used in the IEEE paper are non-overlapping waveforms that provide, except for leakage, no current path between $V_{dd}$ and ground in the circuit of FIG. 1. In the IEEE paper, the unknown capacitance is measured as the difference between two current readings on the two current meters 12, 14 in FIG. 1. The process is flawed because of charge redistribution. The capacitance coupling between two structures, depends on the presence of other nearby structures.

Consider in FIG. 1, two identical load structures, C and C'. The capacitance of C to ground on the right side of the structure is different from the capacitance C' to ground on the left side. The difference is due to the redistribution of the electric field due to the presence of the second conductor 16. The capacitance difference can be quite large.

Configurations like the one shown in FIG. 3, where the load wire 18 and its neighbors 20, 22 are on the same physical layer and are separated by minimum distance, constitute a case where the direct application of the method of the IEEE paper would result in up to 70% error in the extraction of the unknown cross coupling capacitance. There is, in addition, the uncertainty related to the lack of equality in the capacitance of the transistors on the two sides of the mirror structure. This additional source of error becomes more significant as the device size decreases.

SUMMARY OF THE INVENTION

A method and apparatus for determining cross coupling capacitance of wires in an integrated circuit. A first predetermined signal is applied to a first wire. A second predetermined signal is applied to a second wire that is parallel to the first wire. A cross coupling capacitance between the first wire and the second wire is determined based, at least in part, on a current signal.

BRIEF DESCRIPTION OF THE DRAWINGS

The invention is illustrated by way of example, and not by way of limitation in the figures of the accompanying drawings in which like reference numerals refer to similar elements.

DETAILED DESCRIPTION

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The invention provides a method and apparatus for determining cross coupling capacitance of wires in an integrated circuit. Total capacitance can be determined by adding the different cross coupling capacitance. The capacitance information derived according to the invention can be used, for example, to calibrate a parasitic extraction engine or to calibrate an integrated circuit fabrication process. The capacitance information can also be used to improve timing and noise simulations of circuits particularly for deep submicron circuits since wire capacitance effects play a dominant role for deep submicron circuits.

Briefly, the invention allows the measurement of cross coupling capacitance between two lines by applying predetermined voltage signals to specific circuit elements. The resulting current allows for simple computation of cross coupling capacitance, and total capacitance by addition. The capacitance values obtained can then be used to calibrate extraction engines, processes, and provide input to timing and noise simulators.

Figure 1:
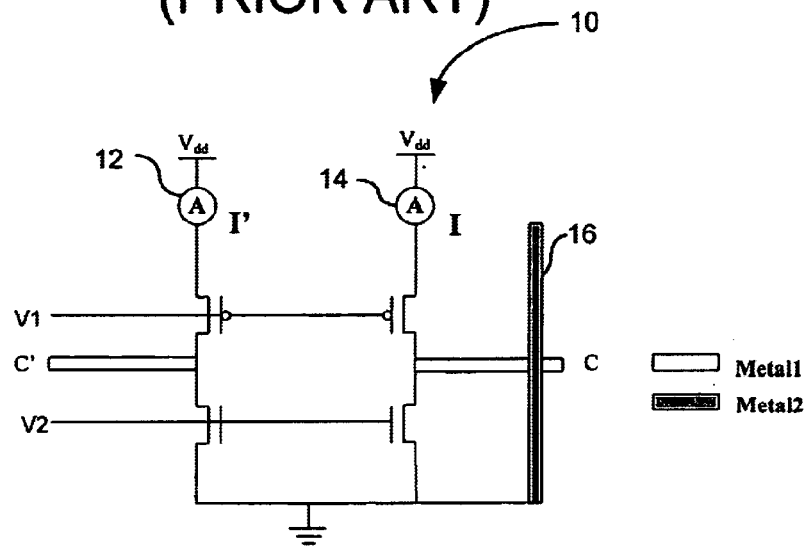
FIG. 1 is a prior art circuit for use in measuring cross coupling capacitance.
Figure 2:
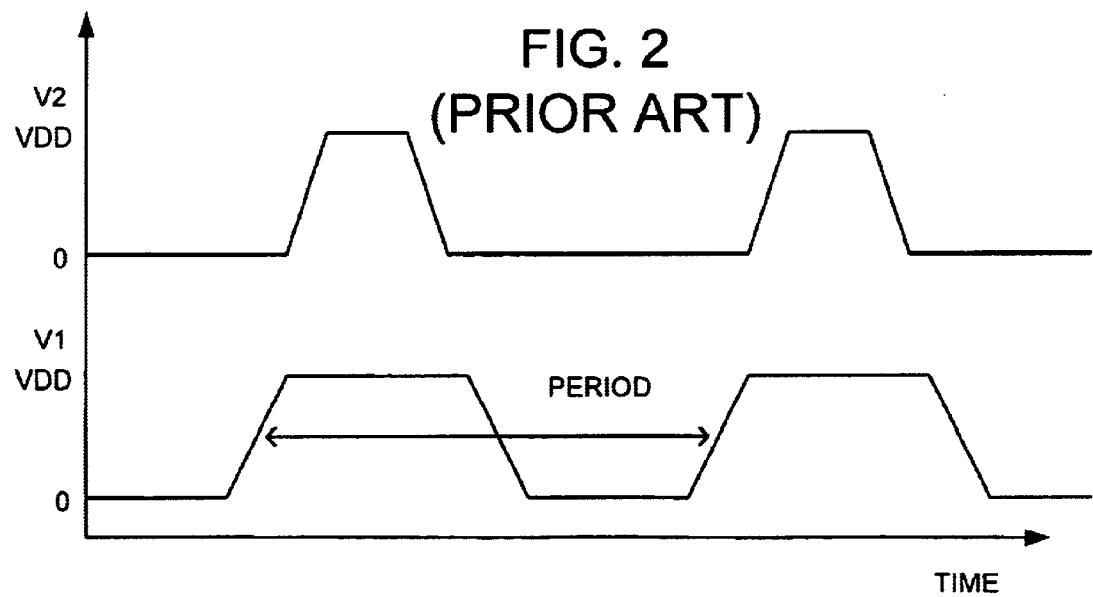
FIG. 2 is a voltage waveform for use to measure the capacitance of the circuit of FIG. 1.
Figure 3:
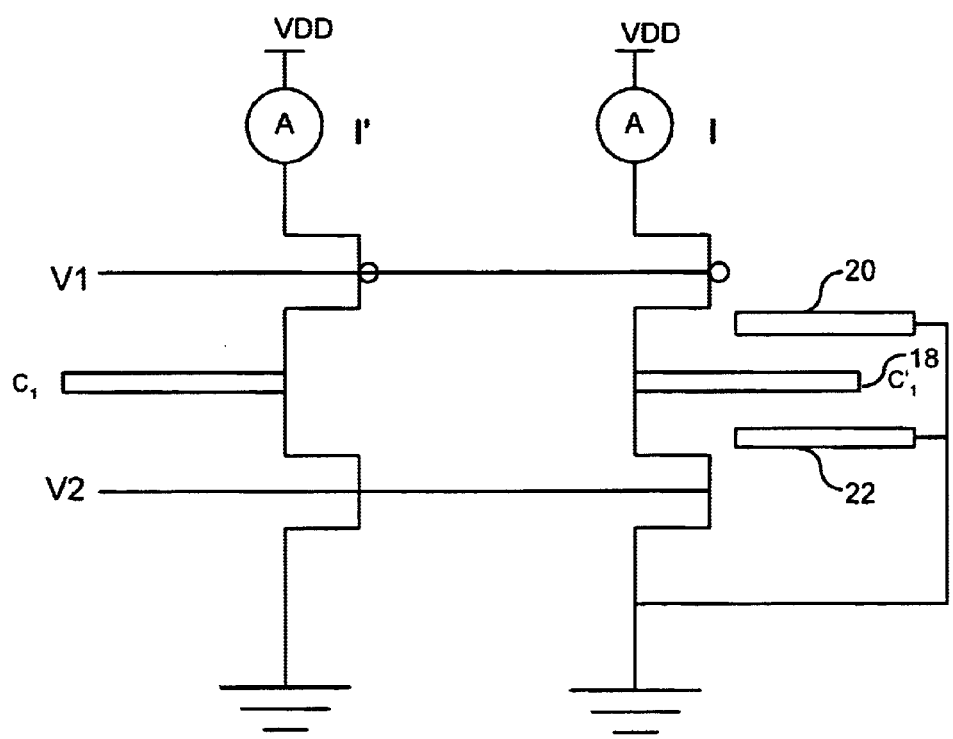
FIG. 3 is a prior art circuit for measuring cross coupling capacitance between parallel wires on the same layer that leads to large errors.
Figure 4:
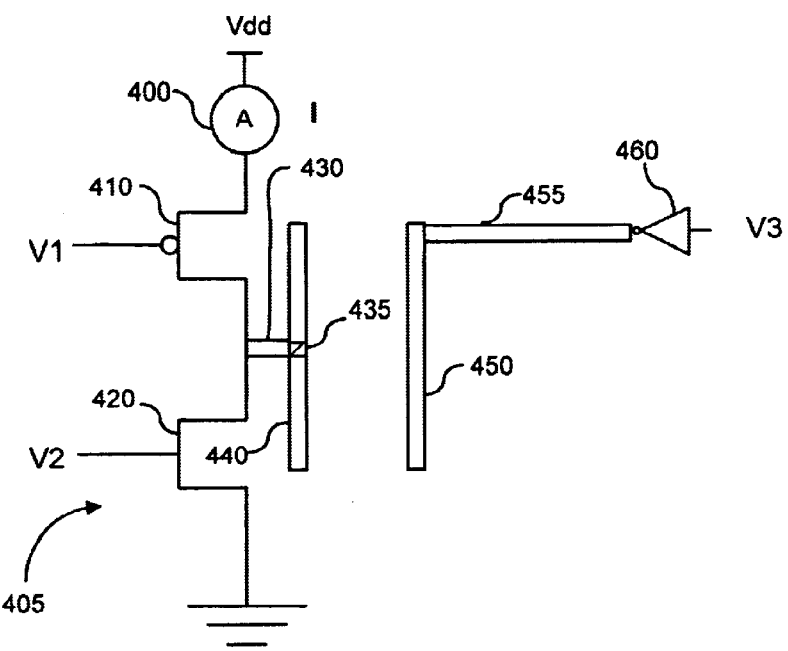
FIG. 4 is a circuit suitable for use in determining cross coupling capacitance according to one embodiment of the invention.

FIG. 4 is a circuit suitable for use in determining cross coupling capacitance according to one embodiment of the invention. The circuit of FIG. 4 removes transistor mismatch and charge redistribution errors, which improves the accuracy of measurement as compared to FIGS. 1 and 3 above.

The main structure 405 of FIG. 4 includes ammeter 400, transistor 410, transistor 420 and a minimum size structure that connects load wire 440 with the main structure. In the example of FIG. 4, load wire 440 and neighbor wire 450 are on the Metal2 layer; however, the particular metal layer or layers the wires are on is not relevant. In the embodiment of FIG. 4, load wire 440 is coupled to the main structure by Metal1-via-Metal2 structure 435 and wire 430.

The circuit of FIG. 4 is used to measure cross coupling capacitance between wire 440 and wire 450. Inverter 460 is coupled to wire 450 by wire 455. In one embodiment, inverter 460 is far enough away from the main structure to reduce noise input on wire 400.

Figure 5:
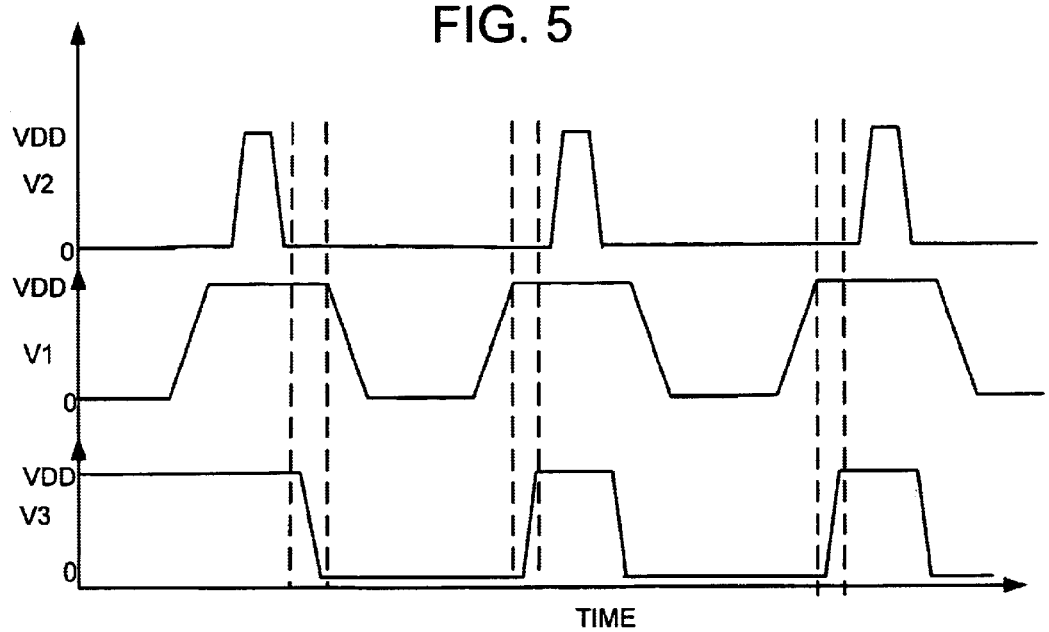
FIG. 5 is a voltage waveform for use in measuring the cross coupling capacitance of the circuit of FIG. 4 according to one embodiment of the invention.

FIG. 5 is a voltage waveform for use in measuring the cross coupling capacitance of the circuit of FIG. 4 according to one embodiment of the invention. Voltage $V_1$ is applied to the gate of transistor 420. Voltage $V_2$ is applied to the gate of transistor 410. Voltage $V_3$ is input to inverter 460. Referring back to FIG. 4, only the portion of the line (i.e., wire 450 and 455) driven by $V_3$ (i.e., wire 450) gives an appreciable contribution to the cross coupling capacitance affecting line segment 440. Capacitance measuring for the circuit of FIG. 4 using the voltage waveforms of FIG. 5 are described below.

Figure 6:
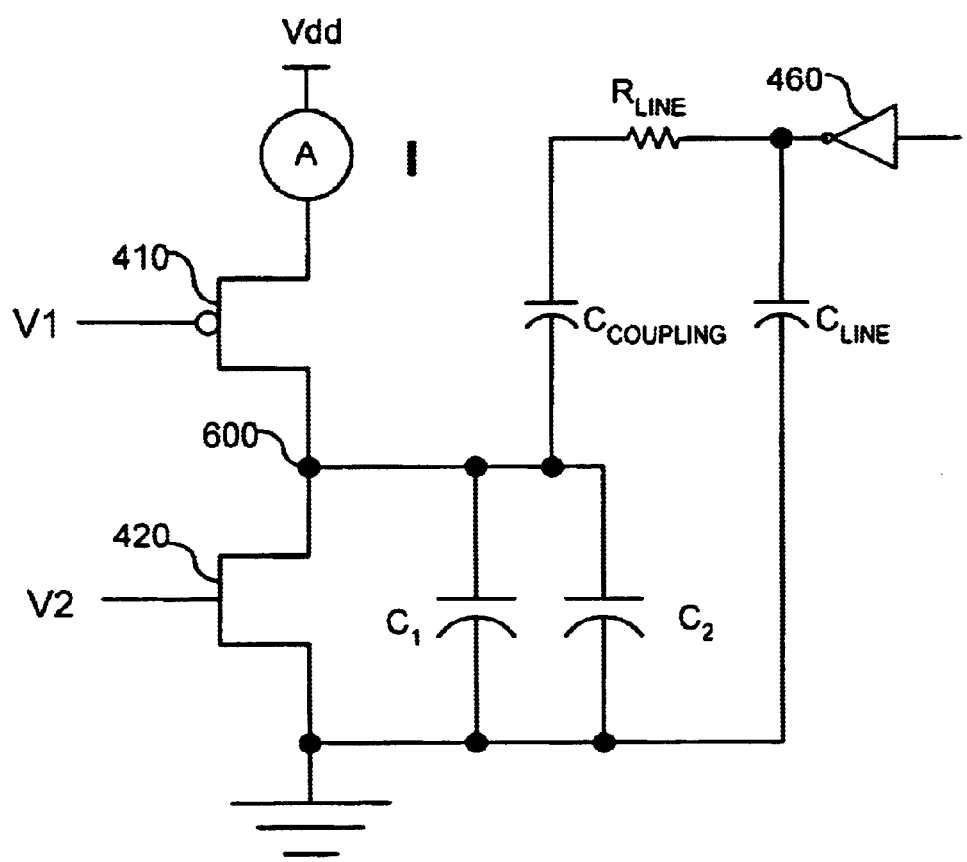
FIG. 6 is an equivalent circuit diagram corresponding to the circuit of FIG. 4.

FIG. 6 is an equivalent circuit diagram corresponding to the circuit of FIG. 4. With reference to the circuit of FIG. 6, the following name convention applies: $C_1$, $C_2$, $C_{line}$, and $C_{coupling}$ refer, respectively, to transistor plus Metal1-via-Metal2 minimum structure and other parasitic capacitances to ground, Metal2 ground capacitance, total capacitance of nearest neighbor, and the capacitance coupling between wires 440 and 450.

Before applying the voltage waveforms of FIG. 5, a voltage $V_3=V_{dd}$, (or ground) is applied to the external inverter 460. Ammeter 400 is used to measure the charge, Q, that flows into node 600 of FIG. 6. Node 600 gets charged when $V_2=V_1=0$, and this charge is equal to:

$$Q=I/f=(C_1+C_2+C_{coupling})V_{dd} \quad \text{(Equation 2)}$$

The measurement proceeds by applying for a sufficiently large number of cycles a periodic signal to $V_3$, having the same frequency as the signal applied to $V_1,V_2$. The relative rise and fall times of the external signals do not matter.

Following the discharge to ground of transistor 420, $V_3$ is switched to ground, and $C_{coupling}$ is charged to $V_{dd}$. This charge redistributes among the capacitors because node 600 is in a high impedance state. The intermediate voltage at node 600 is not important, provided that the switching of transistors 420 and 410 is not altered. Next, $V_1$ is switched to ground and $$Q'=(C_1+C_2)V_{dd} \quad \text{(Equation 3)}$$

flows into node 600. The difference between the direct current readings represented by Equations 2 and 3, (when $V_3=V_{dd}$, on static mode, and when $V_3=0$ on periodic mode) normalized to $V_{dd}$ identifies $C_{coupling}$.

$$C_{coupling}=(Q-Q')/V_{dd} \quad \text{(Equation 4)}$$

The measurement of $C_{coupling}$ in the circuit of FIG. 4 (represented by an equivalent circuit in FIG. 6) is free of transistor capacitance influence and insensitive to charge redistribution errors, as compared to the dual mirror structured circuits described in the IEEE paper. However, errors due to a minimum size probe reaching the Metal2 configuration and errors arising from coupling to the orthogonal portion of the aggressor wire to the wire under test remain. In one embodiment, for a 0.25 $\mu$m process with SiO dielectric, the error bound is 0.02 fF. The magnitude of this error decreases with scaling and lower permitivity dielectric materials. Thus, the measurement described with respect to FIGS. 4–6 allows highly accurate measurement of cross coupling capacitance.

In an alternative embodiment, ammeter 400 can be placed between the source of transistor 420 and ground. This alternative embodiment provides the same accuracy and the embodiments described with respect to FIGS. 4–6.

The measurement technique described with respect to FIGS. 4–6 is based on static charge measurement. To the extent that the dielectric constant of the medium is frequency independent, the total deposited charge is frequency independent. Statistical error can be made negligible by performing multiple charge measurements at the same and different frequencies, or alternatively, measuring the slope of the charge as a function of $V_{dd}$. Both techniques provide a $\sqrt{n}$ improvement in the statistical error, where n is the number of measurements.

The technique of the invention provides improved calibration of several capacitance elements with a single structure because the technique is extensible to simultaneous and non simultaneous switching of multiple neighbors. The timing scheme is similar to the single wire case, with the addition of another voltage signal $V_4$ feeding via another inverter the second neighbor wire. There are two choices for the timing of $V_4$: 1) $V_3=V_4$, the simultaneous switching of the two wires (in this case, the two neighbor wires are identical, and $2C_{coupling}$ is determined thereby halving the absolute error on $C_{coupling}$); or 2)the central wire to the two neighbor wires are determined independently with the same library element, thereby saving valuable space on the silicon chip ($V_4$ has the same sequencing as $V_3$, except that $V_4=V_{dd}$ while $V_3$ is periodic).

The neighbors can be on different metal layers. For example, a general nearest neighbor configuration can consist of nine wires on three metal layers, where, with one library element one can measure all the couplings from the middle wire in the middle layer to each of its neighbors. There are eight couplings that can be measured with one library element via a direct extension of the last procedure. The overall configuration consists of two $V_{dd}$ lines, one common ground line, two voltages feeding, the N and P transistors of the measuring device and eight voltages feeding the eight nearest neighbor wires. The reason for two $V_{dd}$ lines is to separate the $V_{dd}$ for the measuring structure from the $V_{dd}$ feeding the eight inverters, to reduce noise.

This last technique is particularly useful for library validation. Library validation is the process of building sufficient structures to be measured within the same integrated circuit chip to characterize a design. Typically, these libraries can be large but kept reasonably small with non simultaneous switching, as described above. The technique of the invention can also be used to optimize process parameters based on wire timing considerations.

Figure 7:
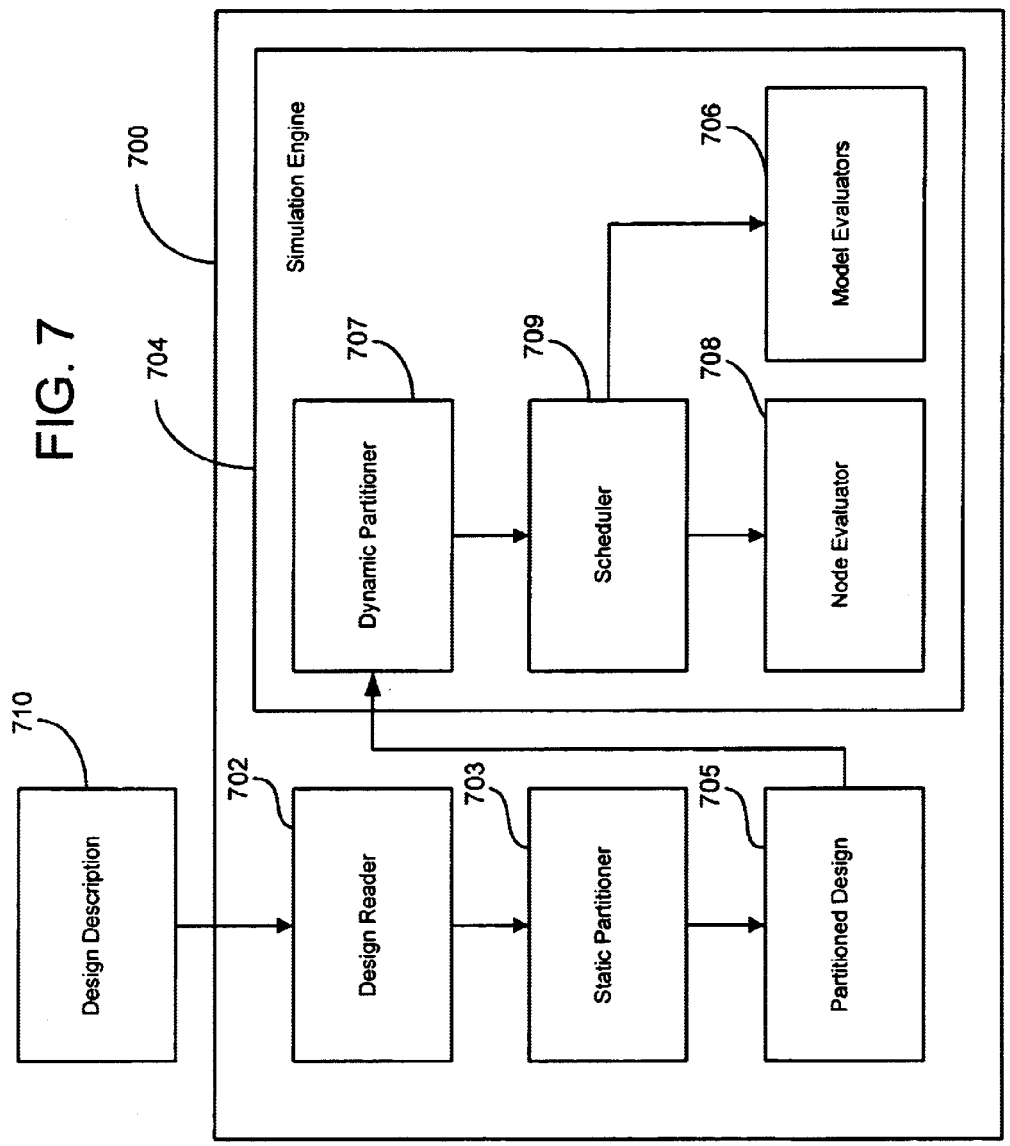
FIG. 7 is a block diagram illustrating an overview of an IC design simulation tool.

FIG. 7 is a block diagram illustrating an overview of an IC design simulation tool. As illustrated, IC design simulation tool 700 is constituted with design reader 702, static partitioner 703 and simulation engine 704 comprising dynamic partitioner 707, scheduler 709, node evaluator 708 and model evaluators 706. The elements are operatively coupled to each other as shown. Design reader 702 and some model evaluators 706, in particular a transistor model evaluator and a wire model evaluator, are incorporated with the teachings of the present invention. Certain aspects of static partitioner 703, dynamic partitioner 707 and scheduler 709 are the subject of co-pending U.S. patent application Ser. No. 09/333,124, filed Jun. 14, 1999, now granted as U.S. Pat. No. 6,480,816, entitled "CIRCUIT SIMULATION USING DYNAMIC PARTITION AND ON-DEMAND EVALUATION" which is hereby fully incorporated by reference.

In one embodiment, the model evaluators evaluate transistor models and wire models having capacitance determined as described above. The capacitance information, both cross-coupling capacitance and total capacitance, can be combined with other device modeling information to provide accurate models and evaluations of the models.

Design reader 702 is used to read design description 710 provided by a designer. Design description 710 includes connectivity information connecting various models modeling electronic devices in the IC design. In one embodiment, in addition to flattening a hierarchical design, design reader 702, also assigns device characterizations to selected ones of the electronic devices of the IC design. In one embodiment the device characterizations are determined as described above. Static partitioner 703 pre-compiles or pre-partitions the IC design into static partitions as well as pre-processes the static partitions into a form particularly suitable for the dynamic partitioner 707.

During simulation, dynamic partitioner 707 further forms and re-forms dynamic partitions of the IC design that are relevant, referencing the pre-formed static partitions. Scheduler 709 determines whether evaluations are necessary for the dynamic partitions for the particular simulation time step, and schedules the dynamic partitions for evaluation on an as-needed or on-demand basis. Accordingly, node evaluator 708 and model evaluators 706 are selectively invoked on an as-needed or on-demand basis to evaluate the states of the connections connecting the models, and various parameter values of the models, such as current, voltage and so forth, respectively.

In one embodiment, at least one of the model evaluators adaptively performs the model evaluations at different accuracy or performance levels in accordance with the assigned device characterizations of the devices. Where accuracy is needed, the evaluations are performed through matrix solution. Formation of static partitions, and formation of dynamic partitions as well as scheduling evaluations on demand, i.e., on an as needed basis are explained in the above identified incorporated by reference co-pending U.S. patent application. Further detail with respect to circuit simulation is provided in co-pending U.S. patent application Ser. No. 09/333,122, filed Jun. 14, 1999, now granted as U.S. Pat. No. 6,397,172, and entitled, "ADAPTIVE INTEGRATED CIRCUIT DESIGN SIMULATION TRANSISTOR MODELING AND EVALUATION," which is hereby fully incorporated by reference.

Figure 8:
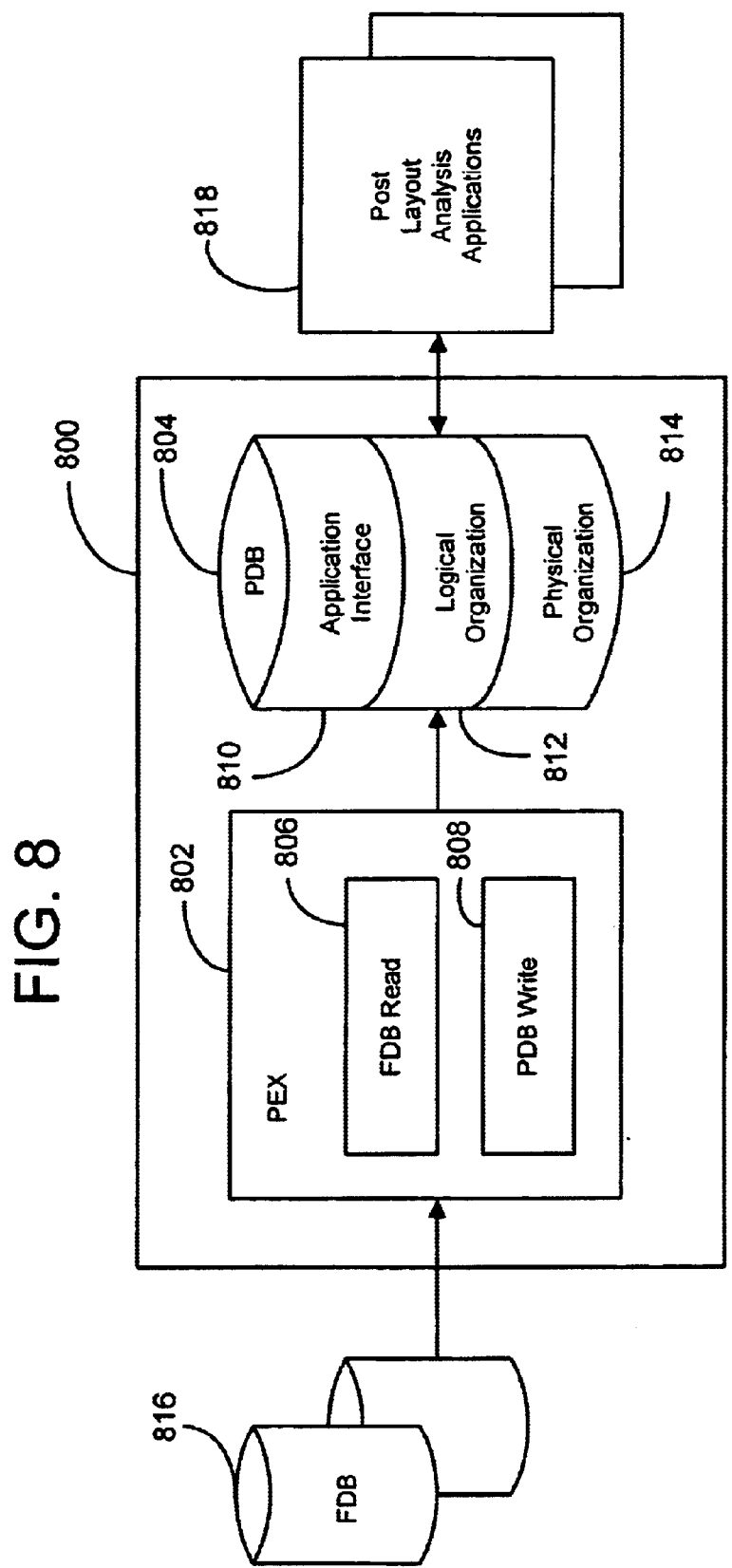
FIG. 8 is a block diagram illustrating one embodiment of a parasitic extraction tool suitable for use with the present invention.

FIG. 8 is a block diagram illustrating one embodiment of a parasitic extraction tool suitable for use with the present invention. As illustrated, the present invention includes parasitic extraction tool (PEX) 802 and parasitic database (PDB) 804. PEX 802 generates electrical modeling data for layout nets of an IC design, e.g. a deep sub-micron IC design, and stores the generated electrical modeling data in PDB 804 for use by client applications, such as post layout analysis applications 818. Examples of post-layout analysis applications 818 include Delay Calculator by Ultima Technology of Sunnyvale, Calif., and Path Mill and Time Mill by Synopsis Inc. of Mountain View, Calif.

PEX 802 generates the electrical modeling data for the layout nets using extracted connectivity and geometrical data of the layout nets. In one embodiment PEX 802 generates capacitive modeling data as described above. As shown, PEX 802 includes read function 806 that operates to input these connectivity and geometrical data of the layout nets. For the illustrated embodiment, the extracted connectivity and geometrical data of the layout nets are input from filtered databases (FDB) 816.

The extracted connectivity and geometrical data are stored in FDB 816 by layout cell hierarchies, one FDB per layout cell hierarchy, and indexed by layout nets. The connectivity and geometrical data were extracted at least in part in accordance with specified parasitic effect windows of the various layers of the IC design. Read function 806 operates to retrieve the connectivity and geometrical data of the layout nets from FDB 816 using the stored layout net indices. FDB 816 is the subject of co-pending U.S. patent application Ser. No. 09/052,895, filed Mar. 31, 1998, now granted as U.S. Pat. No. 6,230,299, and entitled "METHOD AND APPARATUS FOR EXTRACTING AND STORING CONNECTIVITY AND GEOMETRICAL DATA FOR A DEEP SUB-MICRON INTEGRATED CIRCUIT DESIGN," which is assigned to the corporate assignee of the present invention. The co-pending application is hereby fully incorporated by reference.

PDB 804 is designed to accommodate a large volume of electrical modeling data and concurrent accesses by multiple client applications, which is typically of today's and future deep sub-micron IC designs and design environments. For the illustrated embodiment, PDB 804 has physical organization 814 that allows a large volume of electrical modeling data to be stored in multiple physical media, and application interface 810 that shields physical organization 814 from PDB users, e.g. PEX 802 and post layout analysis applications 818. Additionally, PDB 802 has logical organization 812 that abstracts physical organization 814 to facilitate implementation of application interface 810.

For the illustrated embodiment, PEX 802 includes write function 808 that operates to store the generated electrical modeling data of the layout nets into PDB 804 using application interface 810. In alternate embodiments, write function 808 may store the generated electrical modeling data of the layout nets using either logical and/or physical organizations 812–814. Similarly, selected ones of the client applications, e.g. post-layout analysis applications 818, may also elect to access PDB 804 through logical and/or physical organizations 812–814.

Read function 806 and write function 808 are the subject of co-pending U.S. patent application Ser. No. 09/052,915, filed Mar. 31, 1998, now granted as U.S. Pat. No. 6,249,903, entitled "METHOD AND APARATUS FOR GENERATING AND MAINTAINING ELECTRICAL MODELING DATA FOR A DEEP SUB-MICRON INTEGRATED CIRCUIT DESIGN," which is assigned to the corporate assignee of the present invention. The co-pending application is hereby fully incorporated by reference. Except for read function 806 and write function 808, PEX 802 is intended to represent a broad category of electrical modeling tools known in the art. Examples of these electrical modeling tools include but not limited to Pattern Engine of xCalibre by Mentor Graphics, Columbus by Frequency Technology of San Jose, Calif., and Arcadia by Synopsis.

Figure 9:
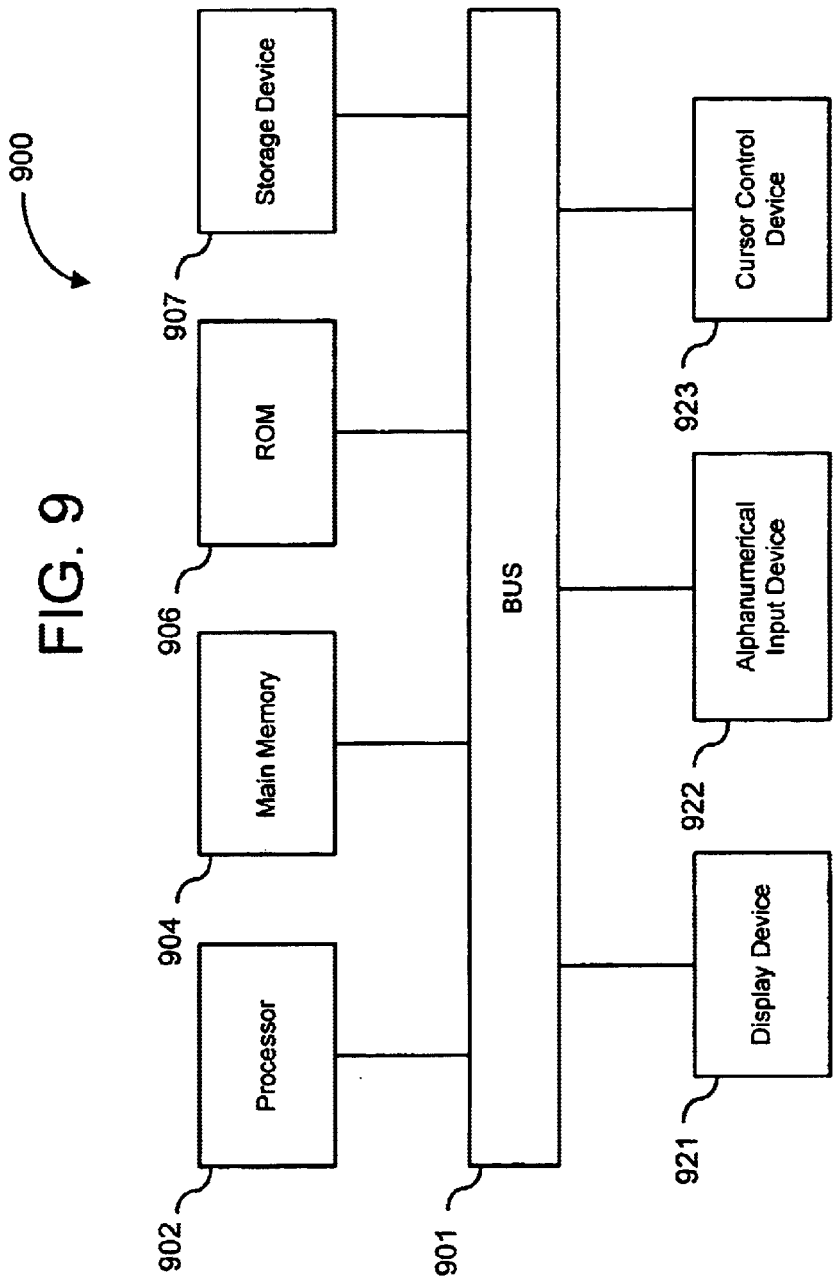
FIG. 9 is one embodiment of a computer system suitable for use with the invention.

FIG. 9 is one embodiment of a computer system suitable for use with the invention. Computer system 900 can be used, for example, for extraction and/or modeling of integrated circuits using the teachings of the present invention. Computer system 900 includes bus 901 or other communication device to communicate information and processor 902 coupled to bus 901 to process information. While computer system 900 is illustrated with a single processor, computer system 900 can include multiple processors and/or co-processors. Computer system 900 further includes random access memory (RAM) or other dynamic storage device 904 (referred to as main memory), coupled to bus 901 to store information and instructions to be executed by processor 902. Main memory 904 also can be used to store temporary variables or other intermediate information during execution of instructions by processor 902.

Computer system 900 also includes read only memory (ROM) and/or other static storage device 906 coupled to bus 901 to store static information and instructions for processor 902. Data storage device 907 is coupled to bus 901 to store information and instructions. Data storage device 907 such as a magnetic disk or optical disc and corresponding drive can be coupled to computer system 900.

Computer system 900 can also be coupled via bus 901 to display device 921, such as a cathode ray tube (CRT) or liquid crystal display (LCD), to display information to a computer user. Alphanumeric input device 922, including alphanumeric and other keys, is typically coupled to bus 901 to communicate information and command selections to processor 902. Another type of user input device is cursor control 923, such as a mouse, a trackball, or cursor direction keys to communicate direction information and command selections to processor 902 and to control cursor movement on display 921.

According to one embodiment, extraction and/or modeling can be performed by computer system 900 in response to processor 902 executing sequences of instructions contained in main memory 904. Instructions are provided to main memory 904 from a storage device, such as magnetic disk, a read-only memory (ROM) integrated circuit (IC), CD-ROM, DVD, via a remote connection (e.g., over a network), etc. In alternative embodiments, hard-wired circuitry can be used in place of or in combination with software instructions to implement the present invention. Thus, the present invention is not limited to any specific combination of hardware circuitry and software instructions.

In the foregoing specification, the invention has been described with reference to specific embodiments thereof (the measurement of a Metal2 wire capacitance coupling to another Metal2 wire). It will, however, be evident that various modifications and changes can be made thereto without departing from the broader spirit and scope of the invention. The specification and drawings are, accordingly, to be regarded in an illustrative rather than a restrictive sense.

What is claimed is:

1. A method for measuring cross-coupling capacitance, comprising:

providing at least first and second wires;

charging the first wire to a predetermined voltage;

performing a first measurement associated with a capacitance of the first wire;

charging the second wire to the predetermined voltage;

recharging the first wire to the predetermined voltage;

performing a second measurement associated with a capacitance of the first wire; and calculating a difference between the first and second measurements to determine the cross-coupling capacitance between the first and second wires;

coupling a first transistor between a supply voltage and a common node, coupling a second transistor in series with the first transistor between the common node and ground, wherein the first wire is coupled to the common node;

applying a first periodic signal to a gate of the first transistor and a second periodic signal to a gate of the second transistor, to periodically charge and discharge the first wire; and further including:

a) grounding the second wire for a first period of time;

b) during the first period of time, applying the first periodic signal to the gate of the first transistor and the second periodic signal to the gate of the second transistor to charge and discharge the first wire, wherein the first and second transistors are not activated simultaneously;

c) repeatedly performing the first measurement during the first period of time and averaging a result of the first measurement;

d) wherein the charging of the second wire occurs for a second period of time;

e) during the second period of time, applying the first periodic signal to the gate of the first transistor and the second periodic signal to the gate of the second transistor to charge and discharge the first wire, wherein the first and second transistors are not activated simultaneously;

f) repeatedly performing the second measurement during the second period of time and averaging a result of the second measurement; and g) wherein calculating the difference between the first and second measurements includes taking the difference between the averaged results of the first and second measurements.

2. A method for determining cross-coupling capacitance, comprising:

applying a first periodic signal to a gate of a first transistor coupled between a supply voltage and a common node;

applying a second periodic signal to a gate of a second transistor coupled between the common node and ground;

using the first and second periodic signals, charging and discharging a first wire coupled to the common node for a period of time;

applying a third periodic signal to charge and discharge a second wire that is in cross-coupling relationship with the first wire;

measuring a first charge that is deposited on the first wire over the period of time, the first charge being measured each time the second wire is grounded;

measuring a second charge that is deposited on the first wire over the period of time, the second charge being measured each time the second wire is charged to the supply voltage; and calculating a difference between the first and second charge to determine the cross-coupling capacitance.

3. The method of claim 2, wherein a single ammeter is used to calculate the cross-coupling capacitance by taking more than one measurement of current through the first wire, the more than one measurement of current comprising at least a measurement of current through the first wire while the first and second wires are both charged to a predetermined voltage, and a measurement of current through the first wire while the first wire charged to a predetermined voltage and the second wire is held to ground.

4. The method of claim 2, further including measuring each of the cross-coupling capacitances for multiple neighbor wires to the first wire.

5. The method of claim 2, wherein measuring the cross-coupling capacitance for the neighbor wires is performed using a same technique as used to measure the cross-coupling capacitance between the first wire and the second wire and using the same transistor configuration.

6. The method of claim 2, wherein the multiple neighbor wires are in an integrated circuit with multiple metal layers and the neighbor wires can be on any of the metal layers and in any orientation relative to each other and to the first wire.

7. The method of claim 2, wherein the third periodic signal is applied to an inverter that charges and discharges the second wire, and only the first, second and third periodic signals are used to cross-coupling capacitance.

8. The method of claim 2, wherein a timing of the periodic signals is such that the first and second transistors are not activated simultaneously.

* * * * *